United States Patent [19]

Luc

[11] 4,355,199

[45] Oct. 19, 1982

[54] CONDUCTIVE CONNECTIONS

[76] Inventor: Penelope J. V. Luc, c/o 38 Church St., Bookham, Surrey, England

[21] Appl. No.: 109,664

[22] Filed: Jan. 4, 1980

Related U.S. Application Data

[63] Continuation of Ser. No. 731,082, Oct. 8, 1976, abandoned.

[30] Foreign Application Priority Data

Oct. 10, 1975 [GB] United Kingdom ............... 41691/75

[51] Int. Cl.[3] .............................................. H05K 1/00
[52] U.S. Cl. .................................. 174/68.5; 361/400; 174/117 A
[58] Field of Search .............. 174/68.5, 117 A, 117 R; 29/628, 627, 629; 361/400; 219/91.21

[56] References Cited

U.S. PATENT DOCUMENTS

| | | | |
|---|---|---|---|
| 2,945,083 | 7/1960 | Ganske et al. | 174/68.5 |
| 3,192,307 | 6/1965 | Lazar | 176/68.5 |
| 3,597,660 | 8/1971 | Jensen et al. | 361/400 |
| 3,614,374 | 10/1971 | Williams | 219/91.21 |
| 3,794,953 | 2/1974 | Malin | 174/117 A |
| 3,831,262 | 8/1974 | Luc | 228/1 |
| 3,969,815 | 7/1976 | Hacke et al. | 174/68.5 |
| 4,000,054 | 12/1976 | Marcantonio | 174/68.5 |

FOREIGN PATENT DOCUMENTS

| | | |
|---|---|---|
| 1403061 | 5/1965 | France ............... 174/68.5 |
| 933842 | 8/1963 | United Kingdom . |
| 940417 | 10/1963 | United Kingdom ............ 68.5/ |
| 1080442 | 8/1967 | United Kingdom . |
| 1171655 | 11/1969 | United Kingdom . |
| 1185857 | 3/1970 | United Kingdom . |
| 1220952 | 1/1971 | United Kingdom . |
| 1224891 | 3/1971 | United Kingdom . |
| 1363805 | 8/1974 | United Kingdom . |
| 1364306 | 8/1974 | United Kingdom . |
| 1380558 | 1/1975 | United Kingdom . |
| 1385473 | 2/1975 | United Kingdom . |

OTHER PUBLICATIONS

IBM Tech. Disclosure Bulletin, "Overlap Electrical Connections Between Memory Planes", vol. 9, No. 1, 6/66. Raacke.
IBM Tech. Disclosure Bulletin, "Method for Producing Three Dimensional Printed Circuits", Klippel, vol. 2, No. 4, 12/59.
Brochure "Vespel Parts", Dupont, 12/77.
Dupont Bulletin H-2, Kapton Polyimide Film, 12/77.
Brochure, "Film for Packaging Laminates", ICI, 12/77.
An Old Discipline and a New Phenomenon–Static Electrification and Spacecraft Charging, Knott et al., ESA, ESTEC, Netherlands Pictures of Geos Spacecraft.

*Primary Examiner*—Bernard Roskoski
*Attorney, Agent, or Firm*—Kenyon & Kenyon

[57] ABSTRACT

A conductive connection between a metallized outer surface of a film of plastics material, such as a polyimide film and a metal or metallized surface of a substrate to which the film is attached. The connection comprises a flexible conductor secured to the substrate and a second film of plastics material which is bonded to the metallized surface of the first film material and to the flexible conductor to effect a conductive connection between the metallized surface of the first film and the substrate. The second film may be so arranged that it holds the flexible conductor in close contact with the metallized layer on the first film to effect an electrical connection but is preferably metallized whereby an additional electrical connection is effected by way of its metallized surface and the flexible conductor.

3 Claims, 10 Drawing Figures

CONDUCTIVE CONNECTIONS

This is a continuation of application Ser. No. 731,082 filed Oct. 8, 1976, now abandoned.

BACKGROUND OF THE INVENTION

This invention relates to conductive connections, such as electrically-conductive connections, and concerns connections between a metallized outer surface of a film material and a metal or metallized surface or a substrate to which the film material is attached or partially covers.

DISCUSSION OF THE PRIOR ART

In one application for such an electrical connection a metal body, or a non metal body having a metal coating or a metallized surface, is covered with a film of an insulating material having its outer surface metallized. For operational reasons it is necessary that the metallized surface of the film material be electrically connected to the metal part of the body to avoid the build up of high electrical charge on it which could interfere with electronic mechanisms in the body or cause arcing and damage to such mechanisms or to parts of the structure. The requirement is therefore for the metallised surface to be "grounded" to the body preferably by means of a low resistance electrical connection. This has been found very difficult to achieve in practice.

Because of the complex shapes the body can take, it has been found necessary to use many small pieces of the film, or tape, in order to ensure that the body is covered satisfactorily with the result that it is then necessary to ground each piece of film individually and "in situ", either by direct or indirect bridging contacts.

One example of such a body has a honeycomb structure clad with aluminium and then covered with a plastic film such as Kapton polyimide film (trade mark) about 12μ thick having a vacuum deposited layer of aluminium about 0.06μ thick on its surface remote from the body. The film is secured to the body by, for example, a double sided adhesive tape. Kapton polyimide film is manufactured by Du Pont and is the subject of a bulletin H-2 issued by Du Pont De Nemours International SA and metallized Kapton polyimide film is the subject of a bulletin H-77 issued by the Electrical Insulation Products Division of Du Pont Film Department.

Difficulty arises when attempting to make an electrical connection to such a metallized film in particular because of the extremely thin metallized layer which does not allow a mechanically strong connection to be made by soldering or conventional welding means, or one having a low resistance to current flow.

Three problems which can be encountered in grounding such a tape are:

(1) Any connection between the aluminized surface of the Kapton tape must itself be grounded to the basic structure it is covering. The connection cannot be made by soldering or by welding of the aluminized surface of the tape to the main structure by conventional means. The configuration and nature of the different elements of the whole structure also make it difficult if not impossible to bolt, tap or screw a connection to it, and such connections are found to deteriorate rapidly with time, either by oxidation or in conditions of extreme variations in temperature where expansion and contraction rates of the elements will vary, either causing loss of electrical contact or giving contacts high resistance value. This is particularly true when this structure is made of aluminium honeycomb with a thin aluminium skin on top, or of anodized aluminium as in some spacecraft for example.

(2) As aforementioned, the metallized layer (of the Kapton) can be less than 1μ thick, is fragile and has comparatively poor adhesion to the film on which it has been deposited. Therefore a mechanically strong electrical connection having a low resistance value has heretofore been found impossible to accomplish. Soldering or welding will volatize or damage such a thin layer.

(3) The Kapton film is infusible, having no melting point. It can resist extremes of temperature and has no known organic solvent. It is therefore very often used as thermal and/or electrical insulation, but as a result it cannot itself assist in securing a mechanically strong electrical connection. This is a further reason why it has been found impossible to weld this material or to weld a metal contact to it by conventional means.

SUMMARY OF THE INVENTION

According to the invention there is provided a conductive connection between a metallized outer surface of a first film material and a metal or metallized surface of a substrate to which the first film material is applied, the connection comprising a conductive member having one portion secured to the substrate and a second film material having portions bonded to portions of both the metallized surface of the first film material and the conductive member in such a manner that the conductive connection is formed by way of the conductive member.

Further according to the invention there is provided a method of making an elctrical connection between a metallized outer surface of a first film material and a metal or metallized surface of a substrate to which the film material is applied, the method comprising the steps of conductively attaching a portion of a conductive member to the said surface of the substrate and arranging a second film material over portions of the metallized surface of the first film material and the conductive material and bonding it thereto.

The conductive member may have a portion arranged to overlie a portion of the metallized surface of the first or second film material.

The second film material may have a non-metallized surface or surfaces, but preferably at least one surface, such as the surface bonded to the first film material and to the conductive material is metallized. In the first case the second film material is bonded to secure the conductive member against or to the metallized surface of the first film. In the second case, electrical connection is additionally made between the metallized surface of the first film material and the conductive material by way of the metallized surface of the second film.

Preferably the conductive member is in the form of an electrically-conductive material, such as a metal foil or tape of aluminium, copper, silver, gold or other metal and is preferably of the same nature as the structure or the metallized layer of the first film material, or both. Alternatively, the conductive member can if required be of a metallized material. This film can be made of orientated polyester such as polyethylene terephthalate; a film of polyamide such as nylon; fluorocarbon such as fluoroethylene propylene copolymer; or a polyamide-imide material such as "Film 700" (Trade mark of Rhone Poulenc).

The first and second film materials may be the same or different and preferably are of a plastics material. For example, the first film material may be a polyimide film, such as that sold under the trade mark KAPTON; a polyamide-imide; a silicon; material, or a thermoplastics material and the second film material may be a plastics material such as a polyimide; an oriented polyester such as polyethylene terephthalate; a thermoplastic material; a polyamide such as nylon; or a fluorocarbon such as fluorethylene propylene copolymer or a polyamide-imide material such as Film 700 (trade mark). When a polyimide film is used for the first film material, the second film material is preferably a polyester material.

The invention may also comprise an electrical connection between a metallized outer surface of a first film material and a metal or metallized surface of a substrate to which the film material is applied, the electrical connection, comprising a second film material having at least one metallized surface which is laid over or between portions of the metallized surface of said first film and the said surface of the substrate and bonded thereto.

The invention may further comprise a method of making an electrical connection between a metallized outer surface of a first film material and a metal or metallized surface of a member to which the film material is applied, comprising conductively attaching portions of a conductive surface of a second film material to said metallized surface of said first film and to said surface of the member.

The first film material may be applied to the substrate so as to be firmly secured, for example by the use of a suitable adhesive such as a contact adhesive, or may be laid on or formed around the substrate and secured thereto, if necessary, by other means.

Preferably the second film material is bonded to the said metallized surface of the first film material and to the conductive material or the substrate by a process as disclosed and/or claimed in the Complete Specifications of British Pat. Nos. 1,080,442; 1,224,891; 1,380,558; 1,385,473 or U.S. Pat. No. 3,831,262.

DESCRIPTION OF THE DRAWINGS

The invention will now be described by way of example with reference to the accompanying drawings, in which.

In the various figures of the drawings, which are not drawn to scale, like parts are given like references. In each case, the connection is shown before the welding operation is carried out.

DETAILED DESCRIPTION OF THE INVENTION

Figure 1:
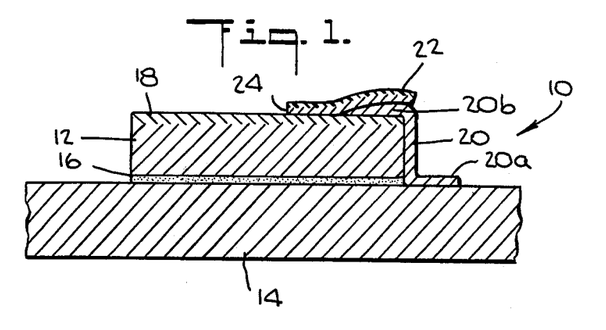
FIG. 1 is a cross-sectional view of an embodiment of an electrical connection according to the invention.

Referring to FIG. 1, there is shown an electrical connection according to the invention. A film 12 of KAPTON (trade mark) polyimide material about 128$\mu$ thick is secured to an aluminium substrate 14 by means of a suitable adhesive 16 such as double sided tape supplied by the 3M Company (unknown adhesive), or all of the class of adhesives such as polyamide-imides, fluorocarbons, epoxies, silicones, polyesters, phenolics, rubbers and blends of these. The film 12 has its outer, upper surface 18 (in the drawing) metallized by the vacuum deposition of aluminium to a thickness of about 0.06$\mu$ and the electrical connection is made between this metallized layer 18 and the aluminium substrate 14.

A strip 20 of aluminium foil has a portion 20a near one end welded to the substrate 14 and is formed so that a portion 20b near its other end overlies and is in contact with the layer 18. Thus an electrical connection is made between layer 18 and substrate 14 but its permanence could not be guaranteed because of the nature, e.g. flimsiness, of the material of the strip 20, and it is substantially impossible to make a strong weld between the strip 20 and the layer 18.

A second film 22 of a thermoplastics material such as an oriented polyester such as Melinex or Mylar (trade marks) is provided having a metallized surface 24 and is laid over portions of the layer 18 and the conductive member 20 as shown with its metallized layer 24 in contact with the layer 18 and member 20.

The film 22 is then bonded to the layer 18 of film 12 and to the strip 20 to provide a permanent electrical connection from layer 18, through layer 24 and aluminium strip 20 to the substrate 14. The film 22 may be bonded to the film 12 and strip 20 and the conductive member 20 may be bonded to the film 12 by a process such as disclosed in the Specifications of British Pat. Nos. 1,080,442; 1,224,891; 1,380,558; 1,385,473 or U.S. Pat. No. 3,831,262.

In a similar arrangement (not shown) the film 22 can be arranged with its metallized layer 24 remote from the surfaces of layer 18 and the strip 20 to provide a permanent electrical connection from the layer 18 to the substrate 14. Both surfaces of the film 22 could also be metallized.

In another similar arrangement (not shown) the film 22 could be non-metallized and bonded to the metallised layer 18 of film 12 and to the strip 20 securely to hold the strip 20 in position and in good electrical contact with the metallized layer 18.

Figure 2:
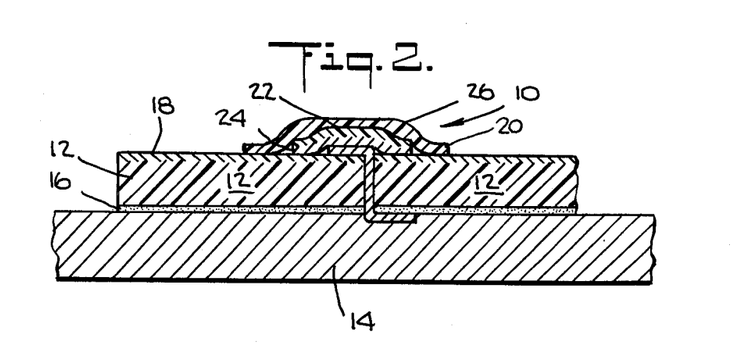
FIG. 2 is a cross-sectional view of another embodiment of an electrical connection according to the invention.

FIG. 2 shows a cross-sectional view of a modification of the connection of FIG. 1 in which the member 20 extends through a slit formed in the film 12 as shown. In addition, a further film 26 of a thermoplastics material, such as a polyester material, is laid over the film 22 and bonded around its periphery thereto to provide some protection for the film 22. Again, the film 26 may be bonded to the film 22 by one of the aforementioned processes.

In the foregoing embodiments, the conductive strip 20 is shown overlying the film 12 but, while preferable in many cases, it is not necessary.

Figure 3:
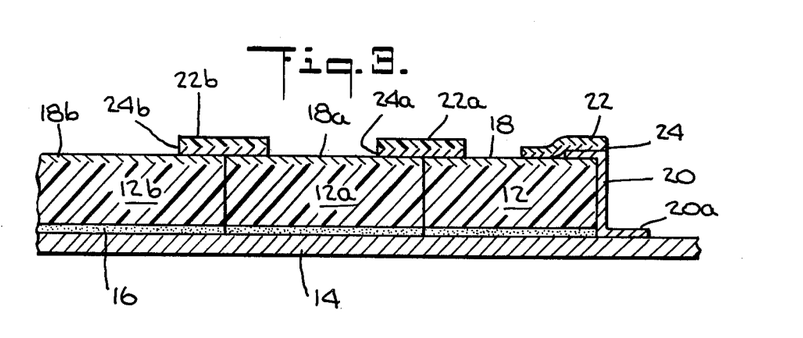
FIG. 3 is a cross-sectional view of another embodiment of a connection according to the invention.

FIG. 3 is a cross-sectional view of another embodiment, similar to that described with reference to FIG. 1, wherein two further layers 12a, 12b of Kapton film are secured to substrate 14 by means of a suitable adhesive 16. The metallized layer 18 of layer 12 is "grounded" to the substrate 14 as hereinbefore described. The metallized layer 18b of film 12b is electrically connected to the metallized layer 18a of film 12a by means of a film 22b having a metallised surface 24b bonded to the layers 18a, 18b as before. (see page 9, lines 11-13) Similarly layer 18a is electrically connected to layer 18 by way of a film 22a having a metallised surface 24a. A good electrical connection can be made even if the metallised layers 24a and 24b are uppermost (in the drawing) and this has the advantage that a layer 24a can be grounded by laying the metallised film 22 over it as well as over the strip 20.

Figure 4:
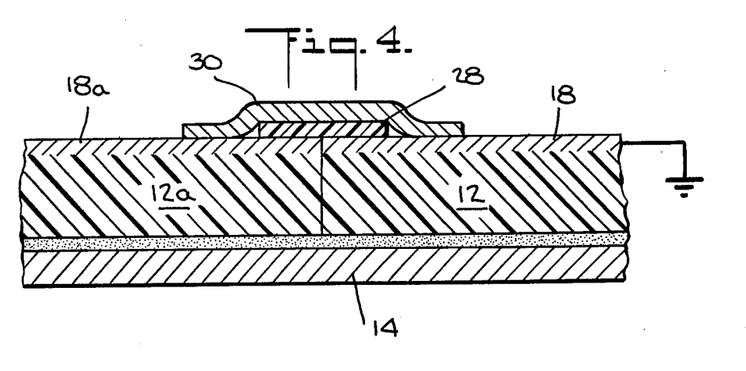
FIG. 4 is a cross-sectional view of another embodiment of a connection according to the invention.

FIG. 4 shows a cross-sectional view of another embodiment of the invention in which the metallized surfaces 18, 18a of two adjacent films 12, 12a are electrically connected by bonding a film 28 of a plastics material such a polyethylene terephthalate, Melinex or Mylar polyester film to the metallised layers 18, 18a and then bonding a conductive, aluminium, foil 30 to the film 28 and to the layers 18, 18a to effect good electrical connection.

Figure 5:
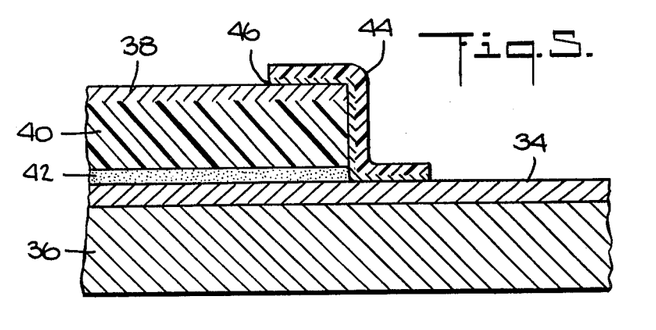
FIG. 5 is a cross-sectional view of another embodiment of a connection according to the invention.

FIG. 5 shows another embodiment of a connection according to the invention in which an electrical connection is made between the metal surface 34 of a substrate 36 and the metallized layer 38 of a plastics film 40 such as Kapton, secured to the surface 34 by means of an adhesive 42. In this case a film 44, of a material such as Kapton or other plastics material for example, a polyester film "Film 700" (polyamide-polyimide) or a fluoro-ethylene propylene copolymer F.E.P. or nylon, and having a metallized layer 46 is bonded to the layers 38 and 34.

In the foregoing examples it is believed that one or more of the various films or conductive strips could be secured to its associated part, additionally by means of an adhesive. In all cases the adhesive used must be suitable both with regard to compatibility with other materials and the physical and chemical conditions to which it is to be subjected.

Figure 6:
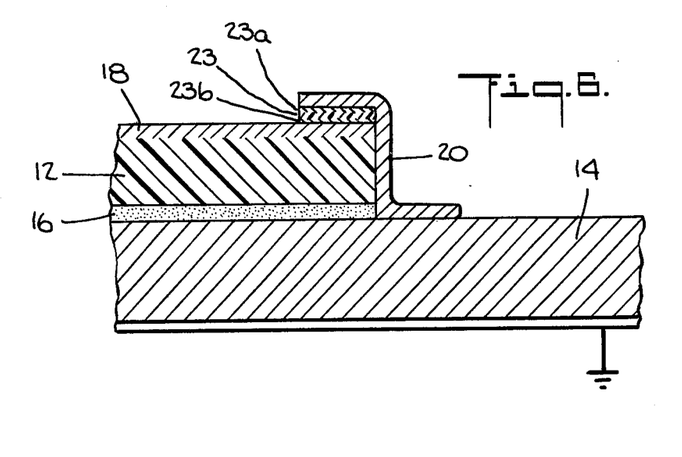
FIG. 6 is a cross-sectional view of another embodiment of a connection according to the invention.

FIG. 6 shows a cross-sectional view of an embodiment of a connection according to the invention which is similar in many respects to the connections as described in relation to FIG. 1. In FIG. 6 a film 23, such as a film of a polyester material, a polyamide, a polyamide-imide or a fluoro-carbon, having metallised surfaces 23a and 23b is inserted between the metallised layer 18 and the metal strip 20, and the layers 18, 23 and 20 are bonded together simultaneously to form an electrical connection between layer 18 and the substrate 14. It is found that a good electrical connection can be made if only one surface of the film 23 is metallised. It has also been found advantageous to form an aperture, or apertures through the film 23 to facilitate contact between the aluminium foil 20 and the metallized layer 18.

Figure 7:
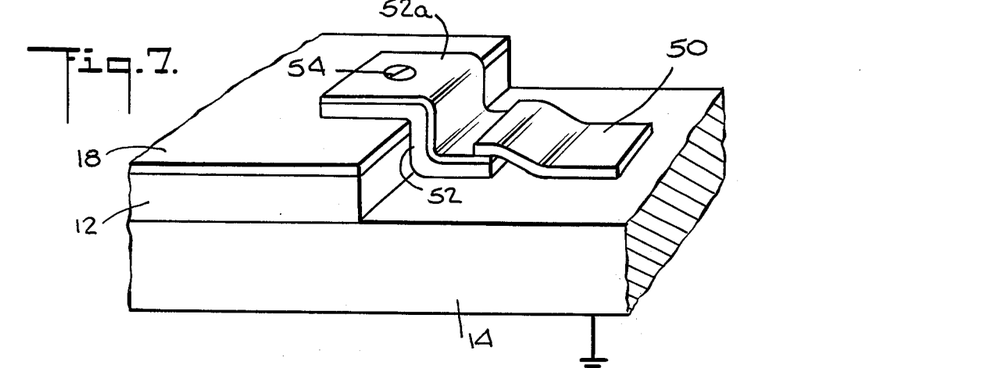
FIGS. 7 to 10 are perspective views of other embodiments of a connection according to the invention.

Yet another contact configuration is shown in FIG. 7 in which a strip 50 of aluminium foil is welded to the metal substrate 14 and then to the uppermost metallized side 52a of a strip 52 of a metallised film of polyester, this film 52 is then placed metallized face 52a up onto the metallized surface 18 and a small flap 54 is cut in the strip 52 and turned under so as to bring the metallized surface 52a of the polyester film into contact with the metallized layer 18. This flap 54 and the contacting end of the film strip is now welded in place thus forming the electrical connection.

Figure 8:
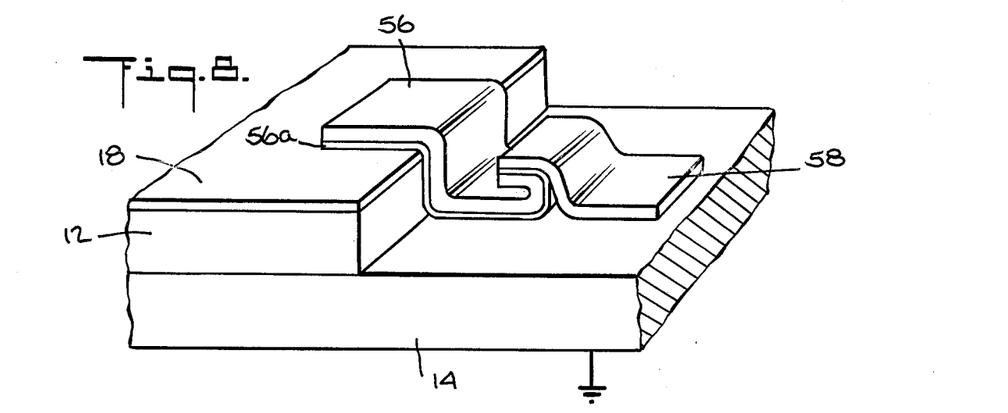

In another contact configuration as shown in FIG. 8, the metallized surface 56a of a polyester film 56 is placed face down on the metallized layer 18 of the Kapton film 12 and welded to it. It is then welded to a strip 58 of aluminium or other metal foil by turning the end of the strip back on itself and so welding its metallized side to aluminium foil strip 58 through foil strip 58.

In yet a further development electrical connections have been made between the metallized surfaces of an insulating material such as polyimide, polyamide-imide and silicone materials and thermoplastics materials such as polyamide, polyester or polyolefin and another metallized surface of a similar or dissimilar material by the use of a bridging strap, strip or wire formed of a material capable of being welded under the conditions of a friction welding process, to both materials. For example two pieces of Kapton having metallized surfaces which can be either adjoining or superimposed, can be connected by means of a metallized film of polyester, or of a polyamide-imide, or a polyamide. The film of polyester can be placed metallised face down onto the metallized Kapton or metallised face up, but the electrical contact will nevertheless be established during the welding operation.

Figures 9, 10:
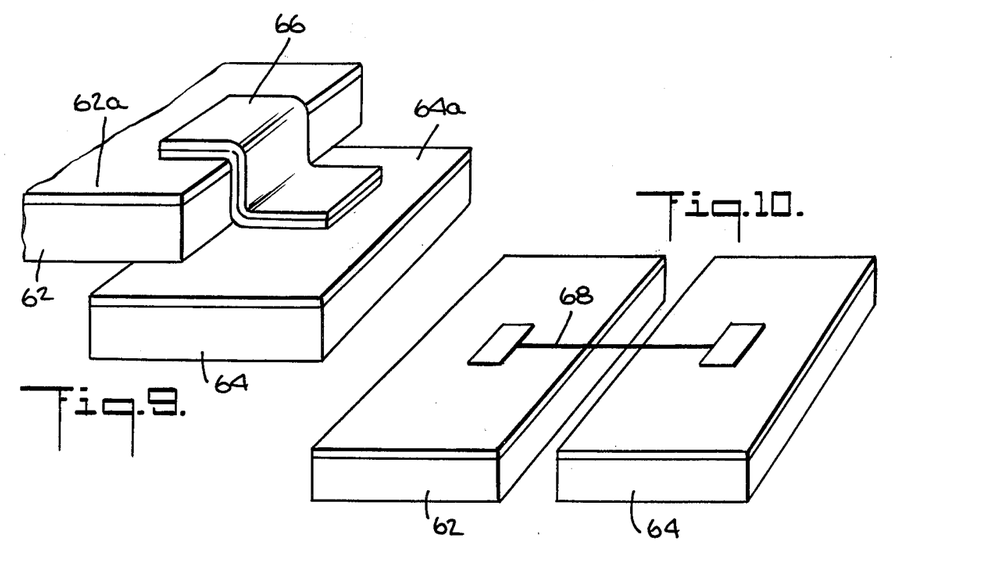

When two pieces 62, 64 of polyester or polyamide-imide or polyamide material having metallized surfaces 62a, 64a are to be electrically connected, this can be done by welding the ends of a strip 66 of a similar material, itself metallized to each piece to be connected. This will form a bridging contact between the two as shown in FIG. 9. Alternatively, the ends of a strip of metal foil or a wire 68 such as aluminium or copper can be welded to each piece of the metallized material 62, 64 as shown in FIG. 10.

A connection according to this invention of the type shown in FIG. 6 which will "ground" the metallized surface 18 of the first film material 12 to the substrate 14, can be made in the following manner. A polyimide (Kapton type H) film 12 metallized on both surfaces comprises the first film material and is applied to a substrate 14 in the form of a circular tube-like body, forming part of a larger structure, by means of a double sided adhesive. A small slit is made in this first film material 12 before it is applied to the substrate 14. The metallized vacuum deposited layers 18 are of aluminium approximately 1 to 3$\mu$ thick.

To fabricate the connection the method steps are as follows:

(1) A length of half hard aluminium foil 15$\mu$ thick and measuring 20 mm $\times$ 6 mm comprising the conductive member has one end 20a spot welded to the structure through the slit in the first film material 12 by means of a wheel of hardened steel having a diameter of 25 mm and a contact surface width of 1.5 mm rotating at a speed of 70,000 rpm, which is brought into contact with the upper surface of the foil for 0.25 sec. welding the lower surface of the foil to the substrate.

(2) A second film material 23 of oriented polyester having a vacuum deposited aluminium surface 23a or 23b is placed between the first film material and the free end of the conductive member which is folded onto it. The metallized layer 23a or 23b of the second film material 23 may be placed either against the metallized layer 18 of the first film material 12 or against the conductive member.

(3) The connection is then welded (end 20b and film 23 welded to layer 18) to achieve the electrical connection by carrying out four spot welds which are achieved by means of a wheel made of Vespel (trade mark of Du Pont de Nemours) polyimide material filled with molybdenum disulphide of 13 mm diameter and having a contact surface or width of 2 mm. While the wheel is rotating at 40,000 rpm its edge or perimeter is brought into contact with a buffer material of polytetrafluoroethylene coated glass cloth covering the connection in the areas where the welds are to be achieved for a period of 0.45 sec. under very light pressure. The welds achieved in this manner establish the electrical connection between the substrate 14 and the metallized surface 18 of the first film material 12. The weld interconnects the conductive member and the first and second film materials. The resistance of this connection when measured remotely is not greater than 10 ohms, while the cover to the connection formed of one end of the conductive member which is welded to the substrate has an electrical connection to this substrate of not more than 0.06 ohms.

The metallized surface 18 of the first film material 12 has a resistance of 3 ohms per $cm^2$. The low resistance of the electrical connection to the structure will however prevent any high electrostatic charge built up on the first film material.

According to this invention an electrical connection of the type shown in FIG. 3 and which serves to create an electrical connection or bridging contact between two sections of similar or dissimilar first film materials can be achieved by laying a length of two sided aluminium metallized polyester film 13 mm long and 6 mm wide and welding it respectively to each section of the first film material. This is done by placing a barrier material in the form of a Kapton type H film over the connection and securing it by two spot welds by use of a wheel of Vespel polyimide material having a diameter of 13 mm and a contact surface or width of 2 mm rotating at a speed of 30,000 rpm which is brought into contact with the barrier material for a period of 0.25 sec. spot welding the metallized layers of the first film materials and the second film material bridge to form an electrical connection between the sections of the first film material. The electrical connection thus formed has a resistance when measured remotely, of less than 15 ohms.

I claim:

1. A conductive connection particularly for use in electrically grounding the exposed metal surface of a spacecraft comprising:
   (a) a structure having a metallic surface;
   (b) a first film material consisting of a non-conductive planar plastic base material to which is affixed an extremely thin metallized upper surface, said first film material being securably affixed, at its plastic base, to a predetermined area on said metallic surface of said structure such that the extremely thin metallized upper surface of said first film material faces away from the metallic surface of said structure and is separated therefrom by said plastic base;
   (c) a conductive member having a first portion securably bonded to, and in direct electrical contact with the metallic surface of said structure at an area removed from the area to which said first film material is applied, and a second portion disposed above, and securably bonded in electrical contact with, the extremely thin metallized surface of said first film material through a second thermoplastic film material interposed such that its entire surface lies between and in contact with said extremely thin metallized surface of said first film material and the second portion of said conductive member, said second film material consisting of a non-conductive plastic planar base material to which a thin metallized layer is affixed on at least one surface thereof.

2. A method for making a conductive connection between:
   (1) the extremely thin metallized upper surface of a first film material, said first film material consisting of a non-conductive planar plastic base material to which said extremely thin metallized upper surface is affixed; and
   (2) the metallic surface of a spacecraft structure to which, at a predetermined area thereon, the film material, at its plastic base, is securably applied, such that the extremely thin metalllized upper surface of said first film material faces away from the metallic surface of the structure and is separated therefrom by the non-conductive plastic base material, said method comprising:
   (a) arranging a flexible, integral conductive member such that a first portion of said conductive member is in direct metal to metal contact with the metallic surface of said structure at an area on said metallic surface removed from the area to which said first film material is applied, and such that a second portion of said conductive member is disposed adjacent the extremely thin metallized upper surface of said first film material;
   (b) providing a flexible, integral second film material, consisting of a non-conductive plastic planar base material to which a thin metallized layer is affixed on at least one surface thereof;
   (c) arranging said second film material such that a first portion thereof is in direct contact with the extremely thin metallized upper surface of said first film material and such that a second portion of said second film material is in direct contact with that portion of said conductive member which is adjacent the extremely thin metallized upper surface of said first film material; and
   (d) bonding the conductive member to the metallic surface of the structure in which it is in direct metal to metal contact; bonding the second film material to the extremely thin metallized upper surface of said first film material in which it is in contact such that an electrical contact is established therebetween; and bonding the contacting portions of the conductive member and the second film material to the extremely thin metallized upper surface of said first film material, such that there is achieved a secured electrical connection between the extremely thin metallized upper surface of said first film material and the metallic surface of said structure and such that all upper or outer surfaces of the connection are metallic, said bonding being achieved by a friction bonding process wherein a relative rubbing movement between a tool and the upper surface of such films or member facing away from the interface of the materials to be bonded is used to join the interfaces without substantial distortion thereof.

3. A method for making a conductive connection between:
   (1) the extremely thin metallized upper surface of a first film material, said first film material consisting of a non-conductive planar plastic base material to which said extremely thin metallized upper surface is affixed; and (2) the metallic surface of a structure to which, at a predetermined area thereon, the film material, at its plastic base, is securably applied, such that the extremely thin metallized upper surface of said first film material faces away from the metallic surface of the structure and is separated therefrom by the non-conductive plastic base material, said method comprising:

(a) arranging a flexible, integral conductive member such that a first portion of said conductive member is in direct metal-to-metal contact with the metallic surface of said structure at an area on said metallic surface removed from the area to which said first film material is applied, and such that a second portion of said conductive member is disposed adjacent the extremely thin metallized upper surface of said first film material;

(b) providing a flexible, integral second film material, consisting of a non-conductive plastic planar base material to which a thin metallized layer is affixed on at least one surface thereof;

(c) arranging said second film material such that its entire surface lies substantially entirely between and in contact with the extremely thin metallized surface of said first film material and the portion of the conductive member which is adjacent, and disposed above, the extremely thin metallized surface of said first film material; and (d) bonding the conductive member to the metallic surface of the structure in which it is in direct metal to metal contact; and bonding to the extremely thin metallized surface of said first film material, through said second film material, the portion of the conductive member disposed thereabove, such that there is achieved a secured electrical connection between the metallic surface of the substrate and the extremely thin metallized surface of the first film material and such that all upper or outer surfaces of the connection are metallic, said bonding being achieved by a friction bonding process wherein a relative rubbing movement between a tool and the upper surface of said conductive member facing away from the interface of it and the material to which it is to be joined is used to join the interface without substantial distortion thereof.

* * * * *

UNITED STATES PATENT AND TRADEMARK OFFICE
CERTIFICATE OF CORRECTION

PATENT NO. : 4,355,199
DATED : October 19, 1982
INVENTOR(S) : Penelope J.V. Luc

It is certified that error appears in the above—identified patent and that said Letters Patent is hereby corrected as shown below:

Column 1, line 26, delete "metallised" and insert --metallized--

Column 2, line 37, delete "elctrical" and insert --electrical--

Column 3, line 7, after "silicon", delete ";"

Column 3, line 7, after "material", delete "," and insert --;--

Column 3, line 19, after "applied", delete "," and insert --;--

Column 3, lines 19 and 20, after "connection", delete ","

Column 3, line 59, "FIG. 6...and" should be a new paragraph

Column 4, line 6, delete "1282" and insert --12 μ--

Column 4, line 9, delete "all" and insert --one--

Column 4, line 10, delete "the" and insert --a--

Column 4, line 48, delete "metallised" and insert --metallized--

Column 5, line 4, delete "metallised" and insert --metallized--

Column 5, line 5, delete ".(see page 9, lines 11-13)" and insert --(See column 4, lines 36-40).--

Column 5, line 18, delete "metallised" and insert --metallized--

Column 5, line 28, after "material", insert --,--

Column 5, line 45, delete "metallised" and insert --metallized--

UNITED STATES PATENT AND TRADEMARK OFFICE
CERTIFICATE OF CORRECTION

PATENT NO. : 4,355,199

DATED : October 19, 1982

INVENTOR(S) : Penelope J.V. Luc

It is certified that error appears in the above—identified patent and that said Letters Patent is hereby corrected as shown below:

Column 5, line 46, delete "metallised" and insert --metallized--

Column 5, line 60, after "placed", insert --with--

Column 6, line 6, after "development", insert --,--

Column 6, lines 19 and 20, delete "metallised" and insert --metallized--

Column 6, line 27, after "metallized", insert --,--

Column 6, line 49, after "member", insert --20--

Column 7, line 22, delete "built" and insert --build--

Column 8, line 16, delete " metalllized" and insert --metallized--

Column 9, line 14, delete "metal-to-metal" and insert --metal to metal--

Signed and Sealed this

Fourteenth Day of August 1984

[SEAL]

Attest:

GERALD J. MOSSINGHOFF

Attesting Officer

Commissioner of Patents and Trademarks